United States Patent
Huang et al.

(10) Patent No.: US 9,368,452 B2
(45) Date of Patent: Jun. 14, 2016

(54) METAL CONDUCTOR CHEMICAL MECHANICAL POLISH

(71) Applicant: Taiwan Semiconductor Manufacturing Company, Ltd., Hsin-Chu (TW)

(72) Inventors: Soon-Kang Huang, Hsin-Chu (TW); Han-Hsin Kuo, Tainan (TW); Chi-Ming Yang, Hsinchu (TW); Shwang-Ming Jeng, Hsin-Chu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 47 days.

(21) Appl. No.: 14/182,912

(22) Filed: Feb. 18, 2014

(65) Prior Publication Data

US 2014/0159243 A1   Jun. 12, 2014

Related U.S. Application Data

(62) Division of application No. 12/829,664, filed on Jul. 2, 2010, now Pat. No. 8,673,783.

(51) Int. Cl.
| | |
|---|---|
| *H01L 23/48* | (2006.01) |
| *H01L 23/538* | (2006.01) |
| *H01L 21/02* | (2006.01) |
| *H01L 21/28* | (2006.01) |
| *H01L 21/768* | (2006.01) |
| *H01L 29/78* | (2006.01) |
| *H01L 21/67* | (2006.01) |
| *H01L 29/49* | (2006.01) |

(52) U.S. Cl.
CPC ...... *H01L 23/5386* (2013.01); *H01L 21/02074* (2013.01); *H01L 21/28079* (2013.01); *H01L 21/67011* (2013.01); *H01L 21/7684* (2013.01); *H01L 29/78* (2013.01); *H01L 29/495* (2013.01); *H01L 2924/0002* (2013.01)

(58) Field of Classification Search
CPC .......... H01L 2224/16227; H01L 2224/81192; H01L 23/49827; H01L 24/03; H01L 24/81
USPC ........................ 257/774, E21.23; 156/345.12
See application file for complete search history.

(56) References Cited

U.S. PATENT DOCUMENTS

| | | | |
|---|---|---|---|
| 5,575,661 A | 11/1996 | Grabbe et al. | |
| 6,200,899 B1 | 3/2001 | Fournier | |
| 6,849,541 B1 | 2/2005 | Hu et al. | |
| 7,185,384 B2 | 3/2007 | Sun et al. | |
| 8,492,276 B2 | 7/2013 | Abe et al. | |
| 2003/0236057 A1* | 12/2003 | Fujita | B24B 37/04 451/41 |

(Continued)

*Primary Examiner* — Andy Huynh
(74) *Attorney, Agent, or Firm* — Haynes and Boone, LLP

(57) ABSTRACT

The present disclosure provides a method of fabricating a semiconductor device, a semiconductor device fabricated by such a method, and a chemical mechanical polishing (CMP) tool for performing such a method. In one embodiment, a method of fabricating a semiconductor device includes providing an integrated circuit (IC) wafer including a metal conductor in a trench of a dielectric layer over a substrate, and performing a chemical mechanical polishing (CMP) process to planarize the metal conductor and the dielectric layer. The method further includes cleaning the planarized metal conductor and dielectric layer to remove residue from the CMP process, rinsing the cleaned metal conductor and dielectric layer with an alcohol, and drying the rinsed metal conductor and dielectric layer in an inert gas environment.

20 Claims, 11 Drawing Sheets

(56) References Cited

U.S. PATENT DOCUMENTS

| | | |
|---|---|---|
| 2007/0082485 A1 | 4/2007 | Chiang et al. |
| 2007/0232069 A1 | 10/2007 | Tseng et al. |
| 2009/0133722 A1 | 5/2009 | Koh et al. |
| 2009/0142916 A1* | 6/2009 | Prenz .................. B24B 9/065 438/598 |
| 2010/0075501 A1* | 3/2010 | Abe .................... C09K 3/1463 438/693 |
| 2010/0232914 A1 | 9/2010 | Adhikari et al. |

\* cited by examiner

METAL CONDUCTOR CHEMICAL MECHANICAL POLISH

CROSS-REFERENCE TO RELATED APPLICATIONS

This application is a divisional of U.S. application Ser. No. 12/829,664, which was filed on Jul. 2, 2010, now allowed, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. In other schemes of metal integration, some form of damascene processing may be involved in which patterns are etched into a dielectric and then the patterns are filled with metal layers by blanket deposition onto the wafer surface, for example by chemical vapor deposition (CVD).

Chemical mechanical polishing (CMP) has become a key technology driver to achieve local or global wafer planarization for submicron advanced semiconductor ICs. The CMP process is used to planarize and remove excess metal over the dielectric and to produce a planar semiconductor structure wherein the metal lines or plugs, barrier metal, and exposed dielectric surfaces are coplanar.

A cleaning process is required after the CMP process to remove contamination introduced during polishing, such as from metal contaminants, slurry, and other particles. However, the cleaning process should not corrode the metal lines or cause defects in the metal line topography. In the past, isopropyl alcohol (IPA) has been used as a final cleaning step to dry processed wafers. However, after vaporization of the IPA, the wafer surfaces have been kept in an open atmosphere environment potentially causing metal corrosion, metal line topography defects (e.g., pitting) from oxidation and moisture in the atmosphere, and/or time dependent dielectric breakdown.

Accordingly, improved post-metal CMP cleaning methods and apparatus for performing such methods are highly desired.

SUMMARY

The present disclosure provides for many different embodiments. One of the broader forms of the present disclosure involves a method of fabricating a semiconductor device. The method includes providing an integrated circuit (IC) wafer having a metal conductor in a trench of a dielectric layer over a substrate, and performing a chemical mechanical polishing (CMP) process to planarize the metal conductor and the dielectric layer. The method further includes cleaning the planarized metal conductor and dielectric layer to remove residue from the CMP process, rinsing the cleaned metal conductor and dielectric layer with an alcohol, and drying the rinsed metal conductor and dielectric layer in an inert gas environment.

Another of the broader forms of the present disclosure involves a semiconductor device. The semiconductor device includes a substrate, a dielectric layer over the substrate, and a metal conductor in a trench of the dielectric layer. The metal conductor and the dielectric layer have a coplanar top surface, which is brush-cleaned, then rinsed with an alcohol, and then vacuum baked in an inert gas environment.

Another of the broader forms of the present disclosure involves a metal CMP tool. The metal CMP tool includes a first front opening unified pod (FOUP) configured to receive an integrated circuit (IC) wafer having a metal conductor in a trench of a dielectric layer over a substrate. The CMP tool further includes a CMP unit operably coupled to the first FOUP, the CMP unit configured to perform a CMP process to planarize the metal conductor and the dielectric layer. A cleaning unit is operably coupled to the CMP unit, the cleaning unit configured to clean the planarized metal conductor and dielectric layer to remove residue from the CMP process, and further configured to rinse the cleaned metal conductor and dielectric layer with an alcohol. A drying unit is operably coupled to the cleaning unit, the drying unit configured to vacuum bake the rinsed metal conductor and dielectric layer in an inert gas environment. A second FOUP is operably coupled to the drying unit, the second FOUP configured to transfer the dried wafer in an inert gas environment.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, although the present disclosure provides examples of a damascene process and a "gate last" metal gate process, one skilled in the art may recognize applicability to other processes and/or use of other materials.

Figure 1:
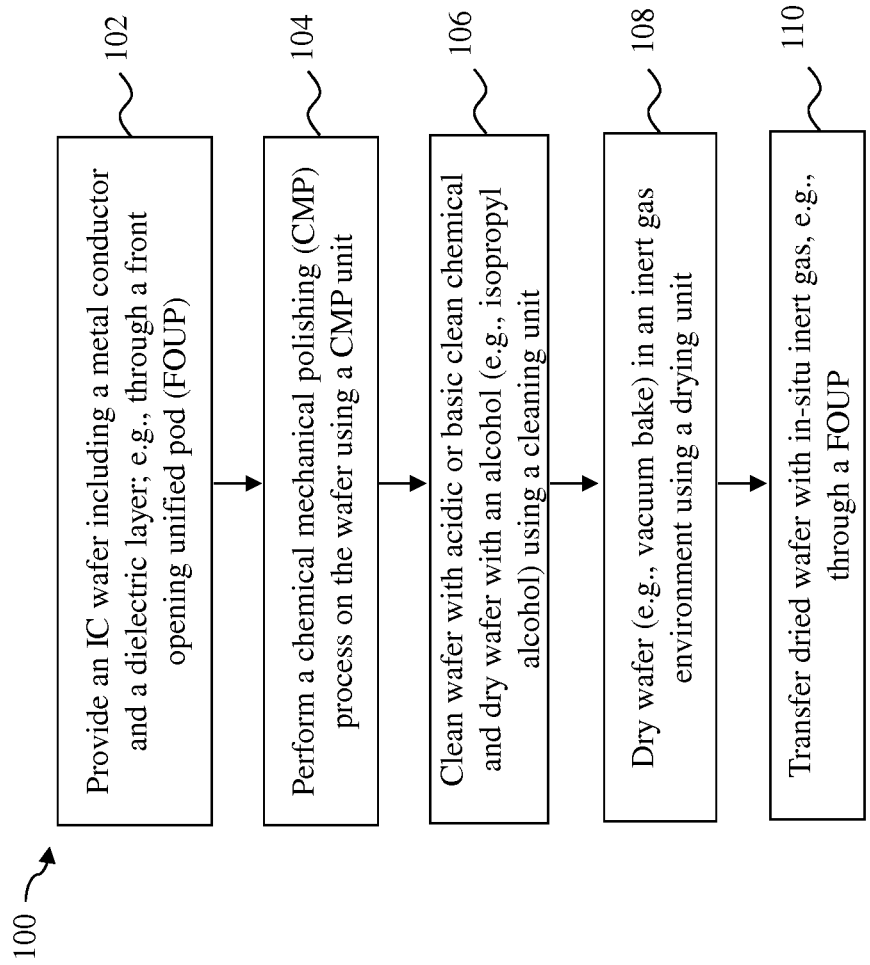
FIG. 1 is a flowchart illustrating a method of fabricating a semiconductor device with a metal conductor in a dielectric over a substrate according to various aspects of the present disclosure.
Figure 2A:
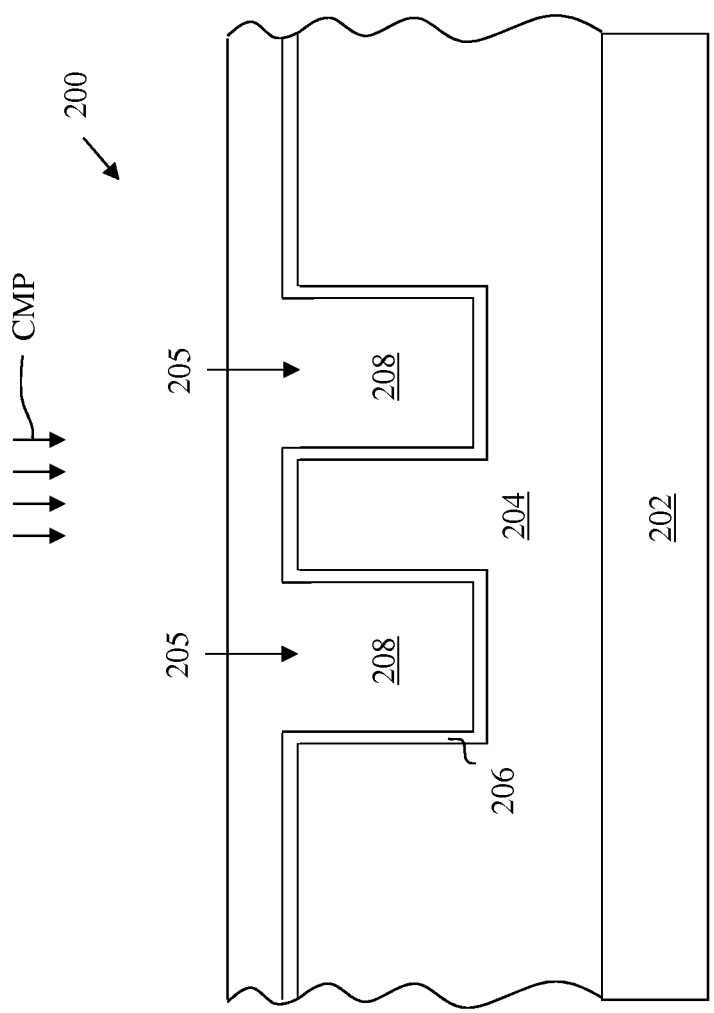
FIGS. 2A to 2C are cross-sectional views of an embodiment of a semiconductor device at various stages of fabrication according to the method of FIG. 1.
Figure 2B:
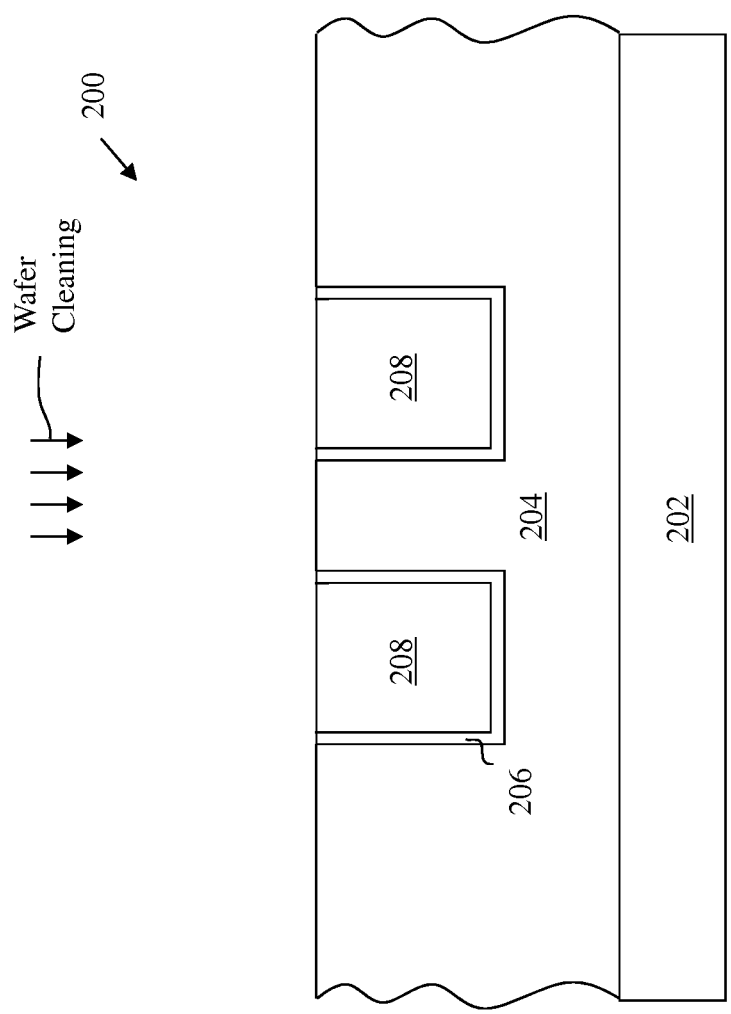
Figure 2C:
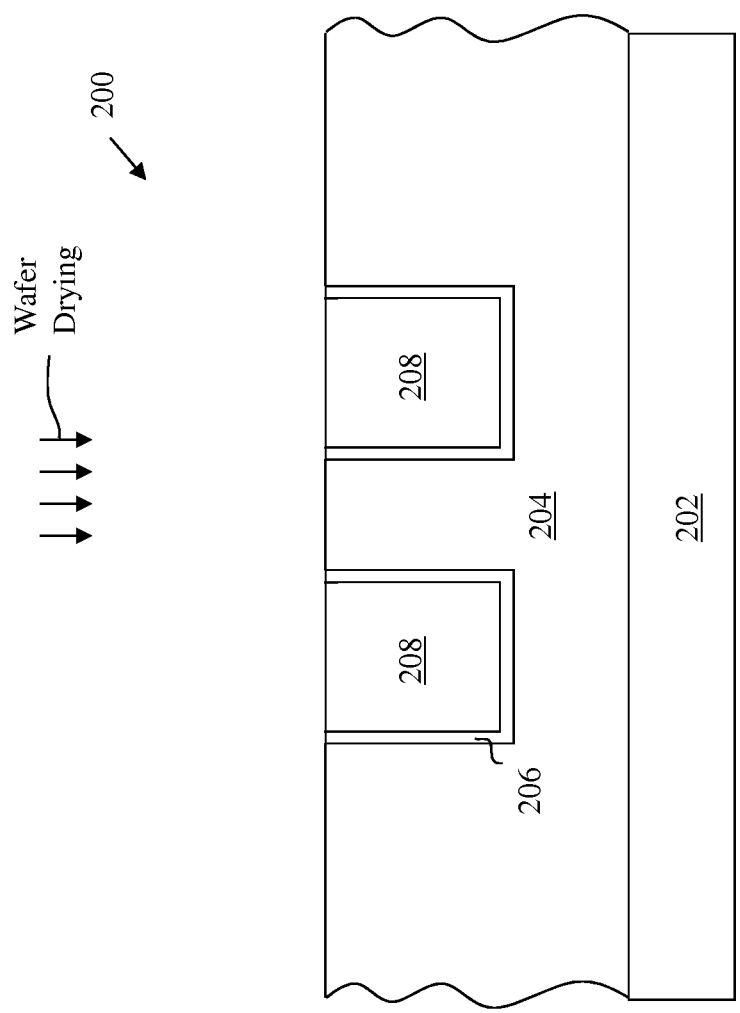
Figure 3A:
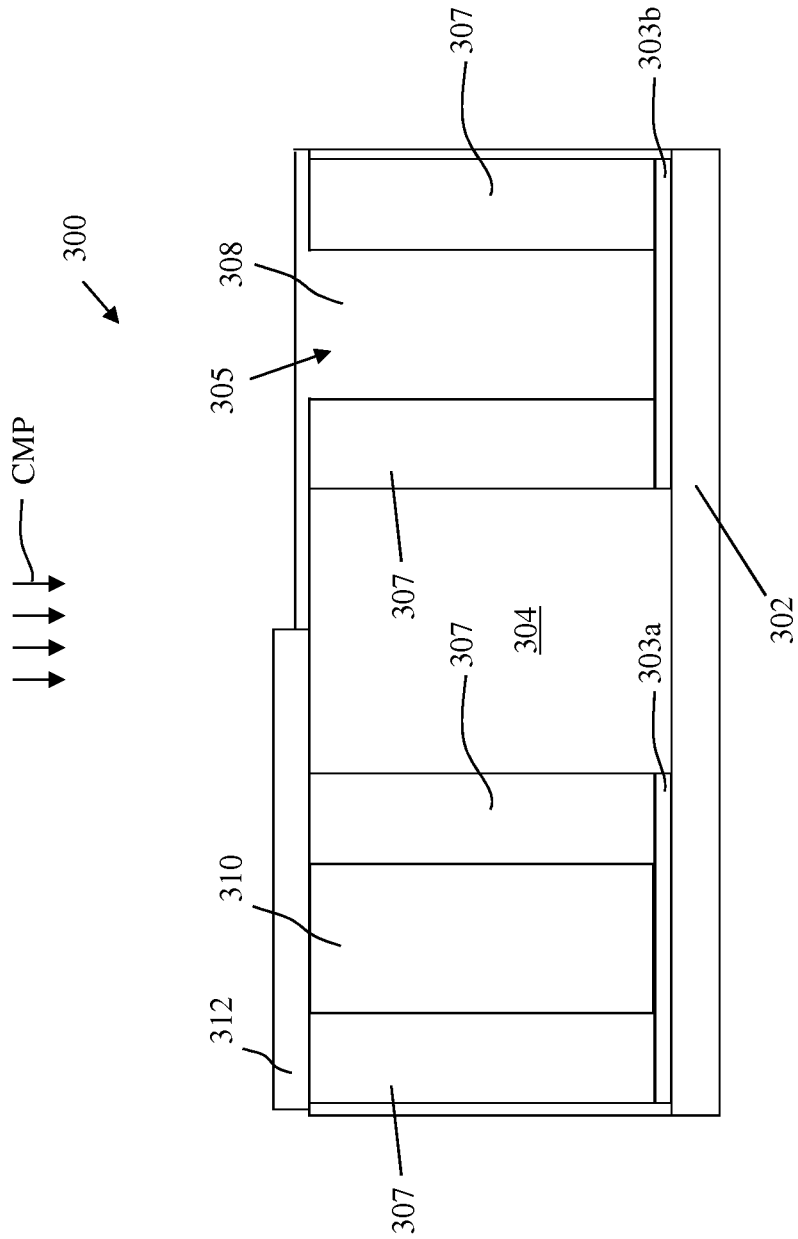
FIGS. 3A to 3C are cross-sectional views of another embodiment of a semiconductor device at various stages of fabrication according to the method of FIG. 1.
Figure 3B:
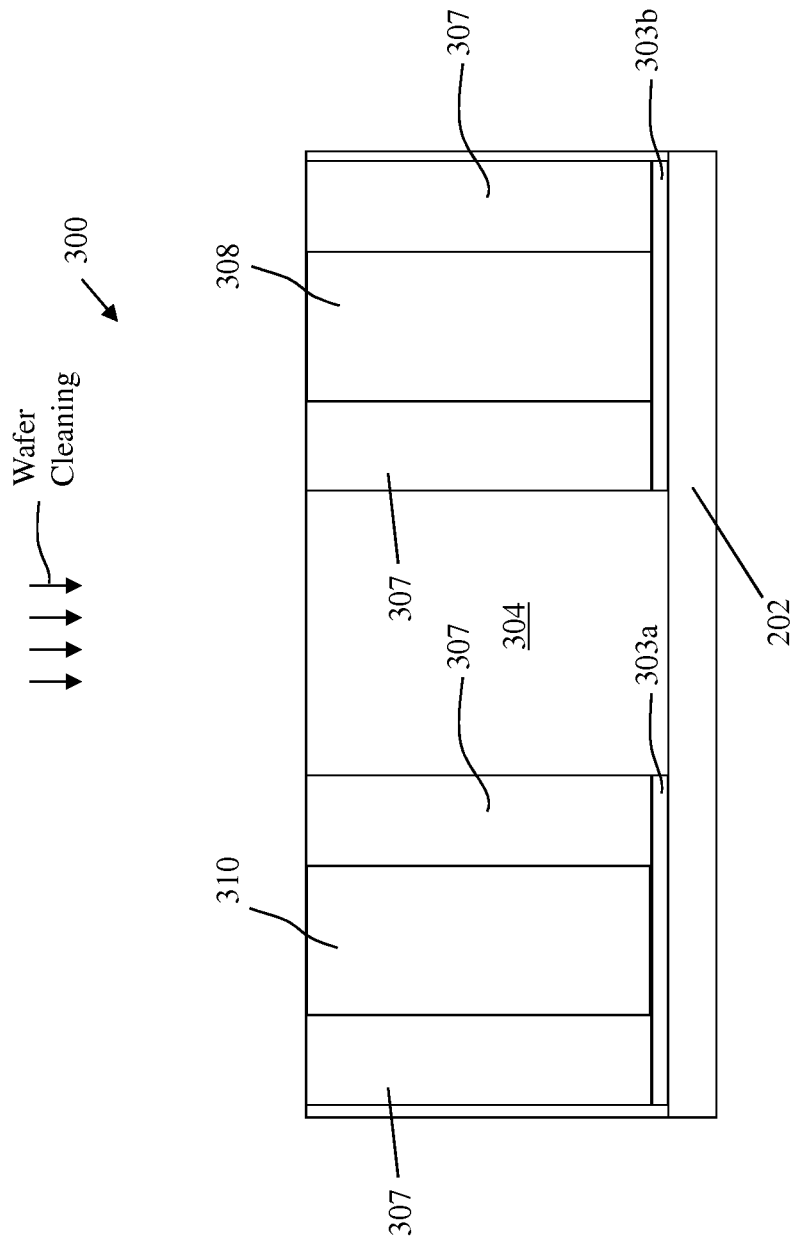
Figure 3C:
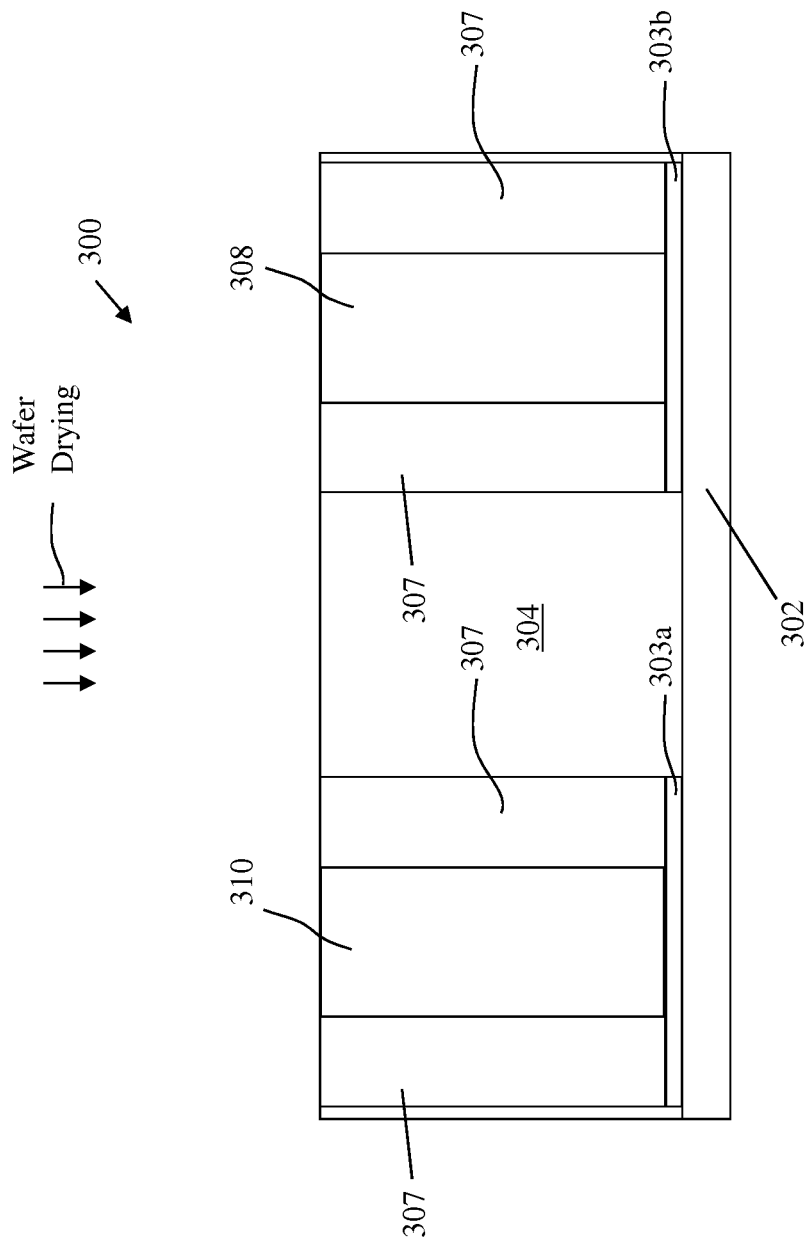
Figure 4A:
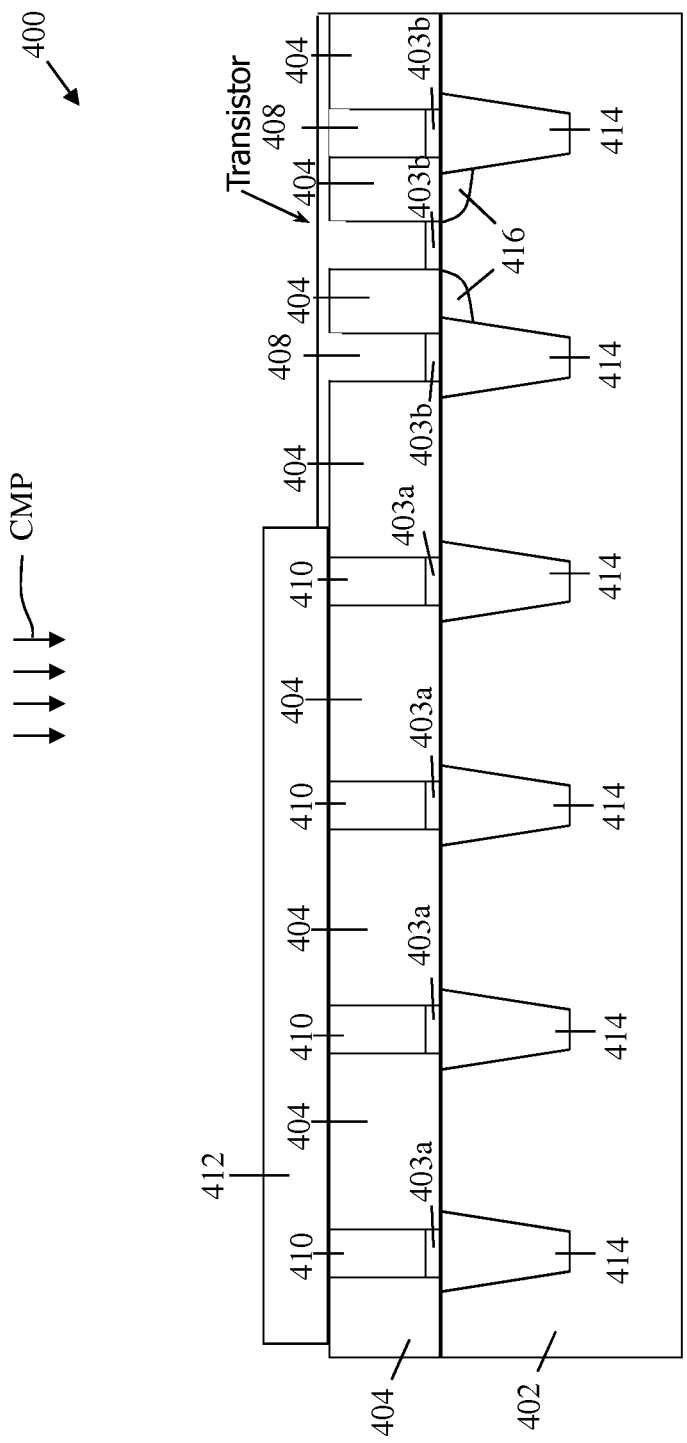
FIGS. 4A to 4C are cross-sectional views of another embodiment of a semiconductor device at various stages of fabrication according to the method of FIG. 1.
Figure 4B:
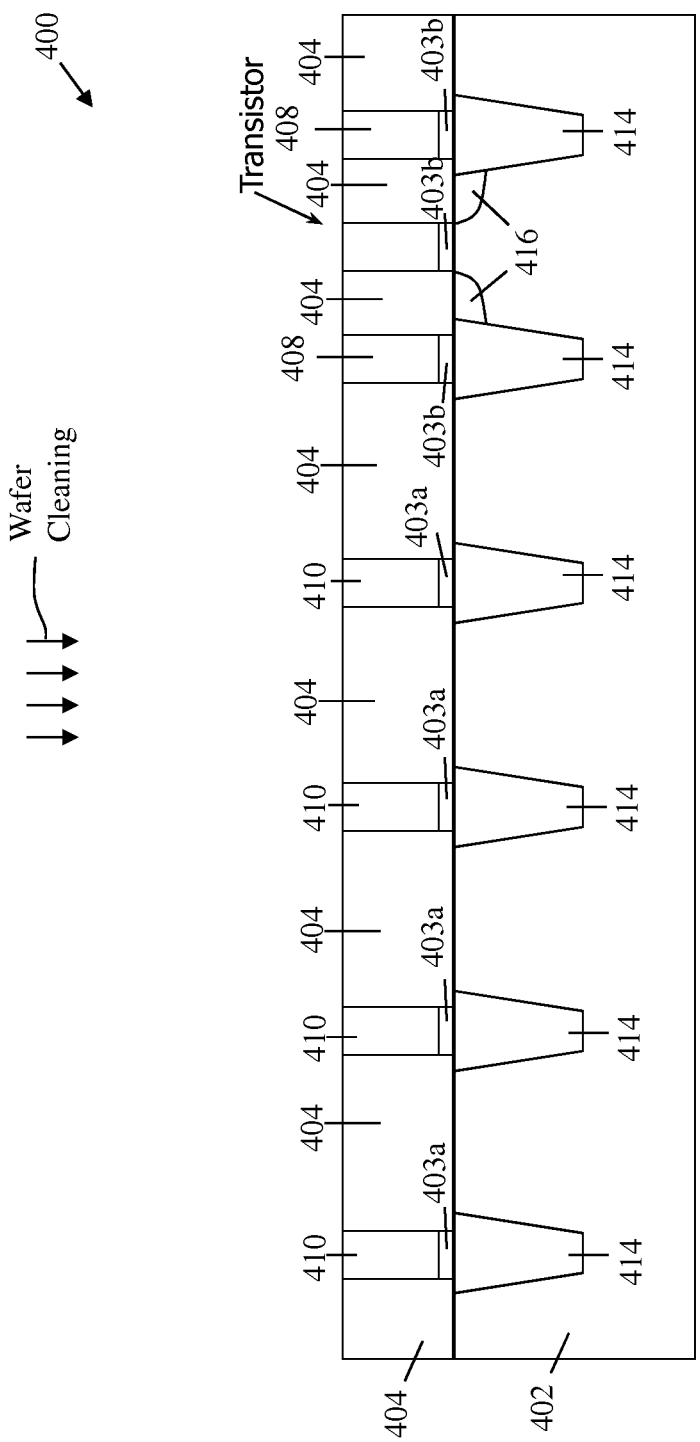
Figure 4C:
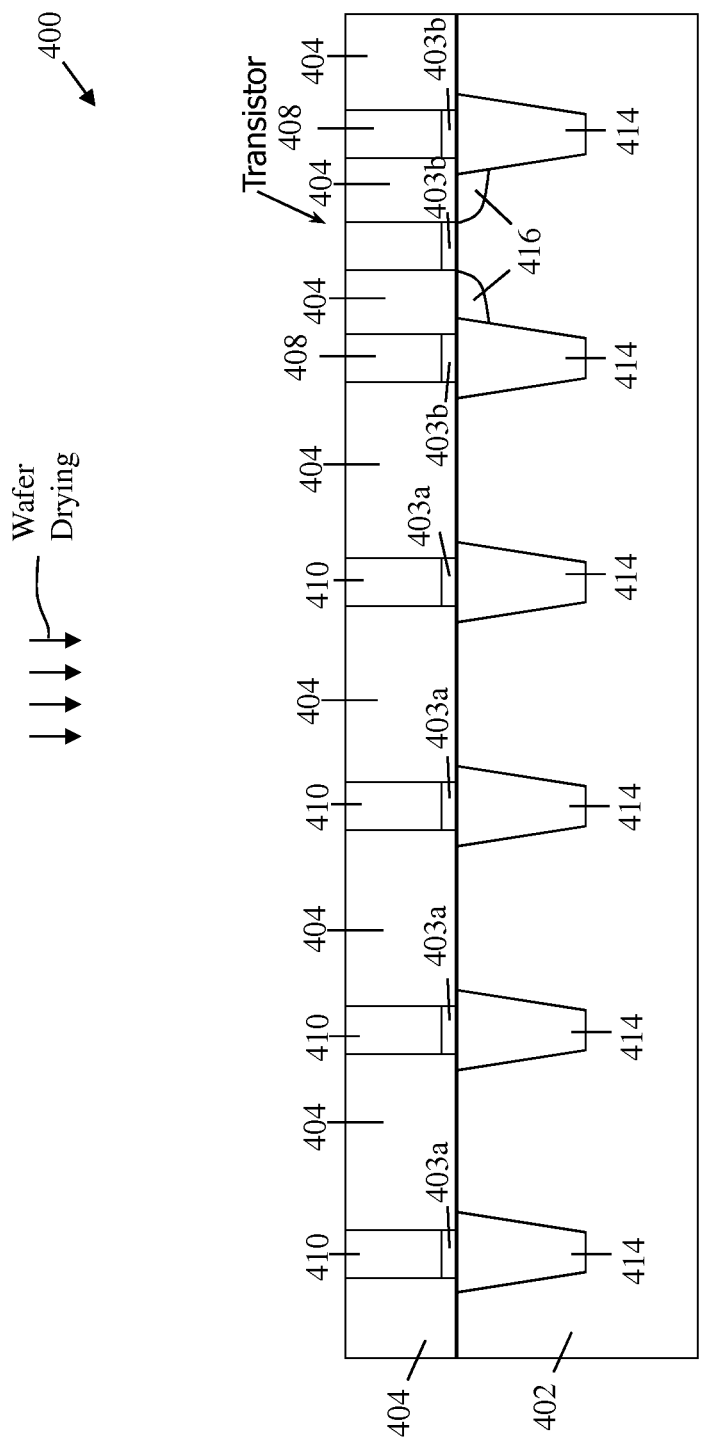
Figure 5:
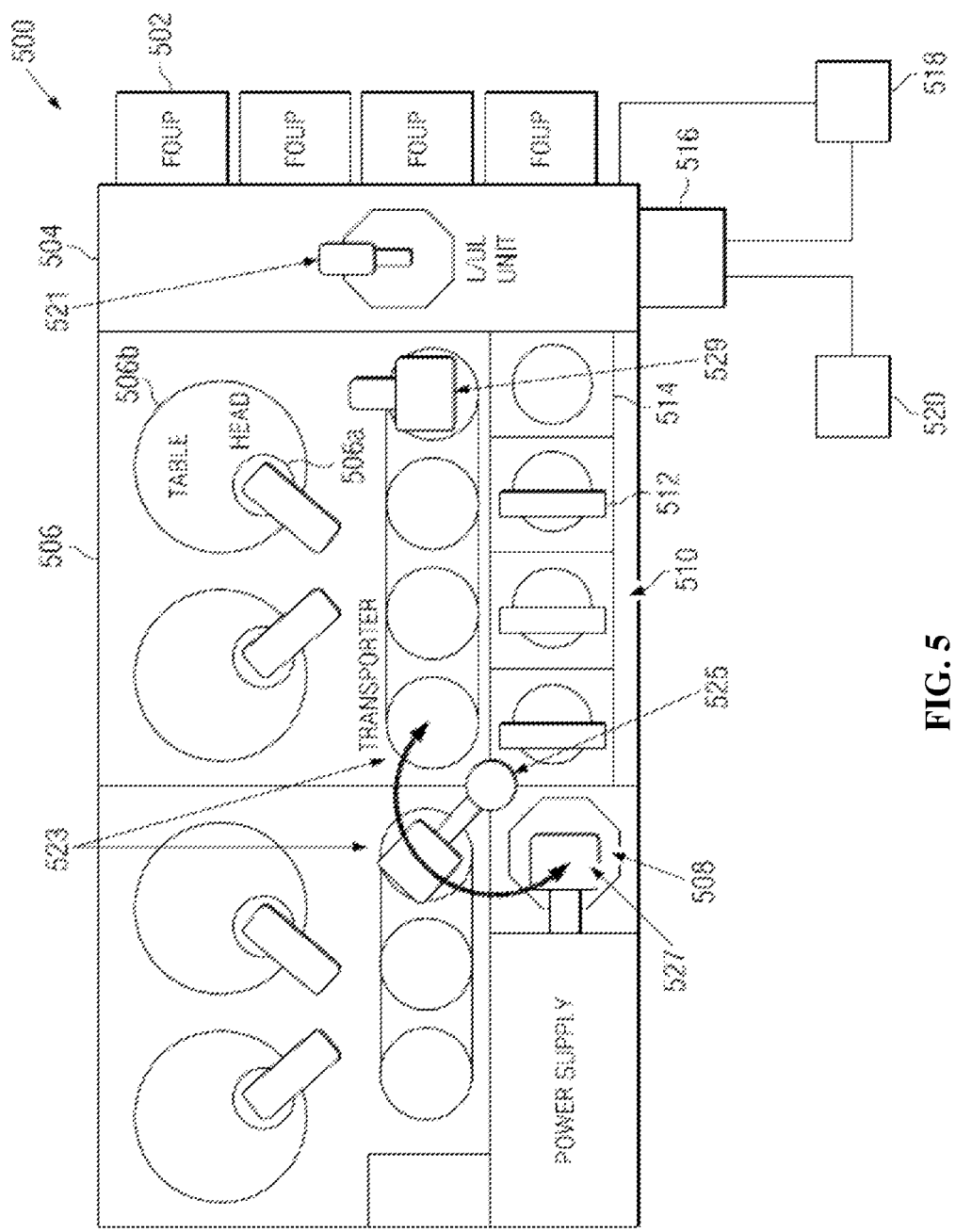
FIG. 5 is a diagram of an embodiment of a metal CMP tool according to various aspects of the present disclosure.

Referring now to the figures, FIG. 1 illustrates a flowchart of a method 100 for fabricating a semiconductor device with improved drying of an integrated circuit (IC) wafer after a metal chemical mechanical polishing (CMP) process according to various aspects of the present disclosure. FIGS. 2A to 2C illustrate cross-sectional views of a semiconductor device 200 at various stages of fabrication according to the method 100 of FIG. 1. It should be noted that part of the semiconductor device 200 may be fabricated with a conductive interconnection or line process flow. Accordingly, it is understood that additional processes may be provided before, during, and after the method 100 of FIG. 1, and that some other processes may only be briefly described herein. FIGS. 3A to 3C are cross-sectional views of another semiconductor device 300 at various stages of fabrication according to the method 100 of FIG. 1. It should be noted that part of the semiconductor device 300 may be fabricated with a CMOS process flow. The semiconductor device 300 may be fabricated in a gate last process (also referred to as a replacement poly gate process (RPG)). In a gate last process, a dummy dielectric and dummy poly gate structure may be initially formed and may be followed by a normal CMOS process flow until deposition of an interlayer dielectric (ILD). The dummy dielectric and dummy poly gate structure may then be removed and replaced with a high-k gate dielectric/metal gate structure. A semiconductor device 400 in FIGS. 4A-4C is similar to the semiconductor device 300 of FIGS. 3A-3C. Accordingly, similar features in FIGS. 3A-3C and 4A-4C are numbered similarly for the sake of simplicity and clarity. FIG. 5 illustrates a diagram of a CMP tool which may be used to perform the method 100 of FIG. 1 according to an aspect of the present disclosure.

Referring now in particular to FIG. 1, the method 100 begins with block 102 in which an IC wafer including a metal conductor and a dielectric layer over a semiconductor substrate is provided, for example through a front opening unified pod (FOUP) of a CMP tool. The method continues with block 104 in which a CMP process is performed on the wafer to planarize the metal conductor and the dielectric layer, for example using a CMP unit of the CMP tool. Next, the method includes cleaning and rinsing the planarized or polished wafer with an acidic or basic cleaning chemical followed with an alcohol to remove residue or contaminants introduced from the CMP process, for example using a cleaning unit of the CMP tool, as shown in block 106. The method continues with block 108 in which the cleaned and rinsed wafer is dried (e.g., vacuum baked) in an inert gas environment, for example using a drying unit of the CMP tool. The method further continues with block 110 in which the dried wafer is transferred for further processing through a FOUP having an in-situ inert gas environment according to various aspects of the present disclosure.

Referring now to FIGS. 2A-2C, cross-sectional views of an embodiment of semiconductor device 200 at various stages of fabrication according to the method 100 of FIG. 1 are illustrated. In FIG. 2A, semiconductor device 200 includes a substrate 202, a dielectric layer 204 disposed over the substrate 202, trenches 205 within the dielectric layer 204, a barrier layer 206 over the trenches 205, and a metal layer 208 over the barrier layer 206. Such a device 200 may be provided in an IC wafer as in block 102 of method 100. Device 200 may be formed as part of a conductive interconnection or line scheme at the surface of the semiconductor wafer. Horizontal structures such as lands for dual damascene and local interconnects, or vertical structures such as studs for interlevel contact in via-holes may be formed. For instance, using standard photolithographic and insulator plasma etch techniques, a recessed pattern of lines or openings may be defined in a planarized dielectric layer. Then a metal layer may be deposited onto the wafer surface to fill the recessed pattern. Excess metal is removed by a CMP process to produce a planar semiconductor structure.

Substrate 202 may be comprised of silicon material or alternatively may include silicon germanium, gallium arsenic, or other suitable semiconductor materials. The substrate 202 may further include doped regions such as a P-well and/or an N-well (not shown). The substrate 202 may also include other features such as a buried layer, and/or an epitaxy layer. Furthermore, the substrate 202 may be a semiconductor on insulator such as silicon on insulator (SOI). In other embodiments, the semiconductor substrate 202 may include a doped epitaxy layer, a gradient semiconductor layer, and/or may further include a semiconductor layer overlying another semiconductor layer of a different type, such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET) in one example.

Dielectric layer 204 is formed over the substrate 202 and may be comprised of one or more of various oxides and/or nitrides formed by applicable means, such as an oxide formed by a high aspect ratio process (HARP) and/or a high density plasma (HDP) chemical vapor deposition (CVD) process in one example. Dielectric layer 204 may be comprised of multiple layers of dielectric material as applicable. Trenches 205 are formed in dielectric layer 204 by traditional photolithographic patterning and etch techniques as are known in the art, such as by the use of photoresist patterning and dry etching.

A barrier layer 206 is then optionally formed over the trenches 205 followed by a metal layer 208. In one embodiment, barrier layer 206 may be comprised of tantalum (Ta), tantalum nitride (TaN), titanium (Ti), titanium nitride (TiN), or alloys thereof deposited by atomic layer deposition (ALD), plasma vapor deposition (PVD), CVD, or other suitable process. Alternatively, the barrier layer may optionally include Si3N4. The barrier layer may include a thickness ranging from about 5 to about 20 angstrom (A). The metal layer 208 may be comprised of aluminum (Al), tungsten (W), copper (Cu), or other suitable metal material deposited by CVD, PVD, electrochemical plating (ECP), or other suitable process.

The method 100 continues with block 104 in which a CMP process is performed on device 200, as shown by the downward arrows in FIG. 2A. The CMP process is performed on the metal layer 208, the barrier layer 206, and the dielectric layer 204, to remove excess metal (e.g., metal outside of the trenches 205), thereby exposing and making coplanar a top surface of each of the metal layer 208, the barrier layer 206, and the dielectric layer 204, as shown in FIG. 2B. The CMP process has a high selectivity to provide a substantially planar surface of the metal layer, the barrier layer, and the dielectric layer. Typical CMP processing may be used, such as mounting the wafer on rotating holders and lowering the wafer onto a pad or table head surface rotating in the opposite direction. A CMP slurry suspended in a mild etchant, such as potassium or ammonium hydroxide, may then be applied to the polishing pad. Typical CMP slurries may be used for the CMP process, such as slurries including ferric nitrate, peroxide, potassium iodate, ammonia, silica, and/or alumina, but other slurry materials are applicable. The rotating wafer is pressed face-down against the rotating polishing pad and the slurry is pressed against the face of the wafer by the pad. A combination of chemical and physical effects removes features from the wafer surface. Typical CMP processing includes: (1) chemical action involving hydroxyl ions attacking silicon oxide, causing surface softening and chemical dissolution, and oxidants enhancing metal dissolution; and (2) mechanical action involving polishing rotation and pressure.

The method 100 continues with block 106 in which a wafer cleaning and rinsing process is performed on device 200, as shown by the downward arrows in FIG. 2B. In one embodiment, the wafer cleaning process may include buffing, brush cleaning, megasonic cleaning, and/or a spin-rinse cycle, for example using a cleaning unit of a CMP tool. Some or all of these processes may be included in the cleaning and rinsing process. Wafers may be buffed using soft pads, oxide slurries, deionized (DI) water, or ammonium hydroxide following metal CMP. Brush cleaning the planarized or polished wafer includes scrubbing the wafer with a cleaning solution to remove residue from the CMP process. Typical scrubbers may be used, including one or more rotating cylindrical brushes that contact and brush the slurry residue, particles, and other contaminants from a wafer surface. Double-sided scrubbers may simultaneously scrub the top and bottom surfaces of a wafer with two rotating cylindrical brushes. Each wafer may lie flat on a conveyor mechanism which moves the wafer into and between the brushes. When the wafer is being scrubbed, the conveyor mechanism, rollers, and brushes may support and hold the wafer horizontally. The wafer itself may be rotated while one or both surfaces are scrubbed by the brushes. One or more rollers may engage the edge of the semiconductor wafer to rotate the wafer. The cleaning solution may include typical cleaning chemistries, such as a surfactant, an acid, an alkaline, and DI water, but other cleaning chemistries are applicable. In one example, the cleaning solution may include hydrofluoric acid, citric acid, ammonium hydroxide, and/or deionized water to remove particles, metal, and oxide. Megasonic cleaning may also be included, such as using sound waves and cleaning chemicals to clean the wafer. The rinsing process may include spinning and rinsing the wafer with a cleaning solution (SC1) and/or water, followed by rinsing and drying with isopropyl alcohol in one embodiment, using the cleaning unit of a CMP tool.

The method 100 continues with block 108 in which a wafer drying process is performed on rinsed device 200, as shown by the downward arrows in FIG. 2C. In one embodiment, the wafer drying process includes vacuum baking the rinsed device in an inert gas environment, for example using a drying unit of a CMP tool. In one embodiment, the vacuum baking process is performed at a temperature between about 25 degrees Celsius and about 400 degrees Celsius, at a pressure between about 0.1 torr and about 760 torr, in an inert gas environment of nitrogen, helium, argon, or mixtures thereof, and for less than five minutes. Advantageously, drying the rinsed device in an inert gas environment prevents corrosion of the exposed surface of metal layer 208, moisture adhesion onto the exposed surface of metal layer 208 from water in the atmosphere (i.e., promotes water desorption), and pitting on the exposed surface of metal layer 208, in particular advantageous when a queue time for further processing is increased. It is noted that the wafer drying process may be performed as a unit part of an integrated CMP tool, or the process may be performed in a stand-alone unit.

The method 100 continues with block 110 in which the dried device 200 is transferred with in-situ inert gas for further processing, in one embodiment through a FOUP of a CMP tool. The inert gas may include nitrogen, helium, argon, or mixtures thereof.

CMP is typically the last step in the damascene sequence and creates the topography on which subsequent layers are built. It is understood that the semiconductor device 200 may undergo further processing to form various features such as capping dielectrics, contacts/vias, interconnect metal layers, interlayer dielectric, passivation layers, etc. It should be noted that the techniques and processes, such as lithography, etching, and high-k/metal gate formation, disclosed above with reference to FIGS. 1 and 2A-2C can also be implemented in the various embodiments disclosed below with reference to FIGS. 3A-3C and 4A-4C.

Referring now to FIGS. 3A to 3C, cross-sectional views of another embodiment of a semiconductor device are illustrated at various stages of fabrication according to the method 100 of FIG. 1. In FIG. 3A, semiconductor device 300 includes a substrate 302, a dielectric layer (e.g., an interlayer dielectric (ILD) 304) over the substrate 302, a dummy gate 310, and a metal gate structure 308 within the dielectric layer 304. Such a device 300 may be provided in an IC wafer as in block 102 of method 100.

In this embodiment, substrate 302 is a silicon substrate having a first region (e.g., a region for a transistor) and having a second region (e.g., a region for an inductor or other similar device). The substrate 302 may alternatively include silicon germanium, gallium arsenic, or other suitable semiconductor materials. Similar to the substrate 202 described above, the substrate 302 may further include doped regions such as a P-well and/or an N-well (not shown). The substrate 302 may also further include other features such as a buried layer, and/or an epitaxy layer. Furthermore, the substrate 302 may be a semiconductor on insulator such as silicon on insulator (SOI). In other embodiments, the semiconductor substrate 302 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET).

To form device 300, a first gate structure is formed over the first region and a second gate structure is formed over the second region. The gate structures each include spacers 307 and a dummy polysilicon (or poly) layer/gate. The formation of the gate structures includes forming various material layers, and etching/patterning the various material layers to form a gate structure. The semiconductor device 300 may include a dummy insulator layer 303a formed over the substrate 302. In the alternative, an insulator layer including an interfacial layer, a high k dielectric layer and/or a barrier layer may be formed on the substrate 302 and left in the final device. In one example, the dummy dielectric layer may include an oxide (e.g., thermal or chemical oxide formation).

The semiconductor device 300 includes a dummy polysilicon (or poly) layer 310 formed over the insulator layer 303a by a suitable deposition process. For example, silane (SiH4), di-silane (Si2H6), or di-clorsilane (SiCl2H4) may be used as a chemical gas in a CVD process to form the poly layer 310. Alternatively, an amorphous silicon layer may optionally be formed instead of the polysilicon layer.

ILD 304 is formed over the substrate 302 and over the gate structures in the first and second regions. ILD 304 may include an oxide formed by a high aspect ratio process (HARP) and/or high density plasma (HDP) CVD process. The deposition of the ILD 304 fills in the gaps between the adjacent gate structures. Thereafter, a CMP process is performed on the ILD 304 to planarize the ILD 304 until the dummy poly gates are exposed.

A photoresist (PR) layer 312 is formed over the substrate 302, the spacers 307 and the poly layer 310 in the second region. The PR 312 layer is formed on the device 300 to protect a portion of the device 300, such as one or more of the gate structures. The patterned photoresist layer 312 may be formed by photolithography, immersion lithography, ion-beam writing, or other suitable techniques. For example, the photolithography process may include spin-coating, soft-baking, exposure, post-baking, developing, rinsing, drying, and other suitable processes. After formation of the patterned PR 312, the semiconductor device 300 may undergo additional processing (e.g., CMOS processing) to form various features.

A dummy gate not shielded by PR 312 is removed thereby forming a trench 305 in the gate structure. The dummy poly gates 310 in the gate structure may be removed by a dry etching, wet etching, or combination dry and wet etching process thereby forming a full trench 305. For example, a wet etching process may include exposure to a hydroxide containing solution (e.g., ammonium hydroxide), de-ionized water, and/or other suitable etchant solutions. Etching the poly layer may be performed using HBr, CF4, Cl2, O2 or HeO2 at a temperature of about 0° C.-100° C.

The dummy poly gate and dummy dielectrics may be removed in a single-step etching process or multiple-step etching process. For example, a first wet etch process may be used to remove the dummy poly gate. The first wet etch process may include exposure to a hydroxide containing solution (e.g., ammonium hydroxide), deionized water, and/or other suitable etchant solutions. A second wet etch process may be used to remove the dummy dielectric. The second wet etch process may include exposure to a buffered HF solution or a buffered oxide etchant (BOE). The second wet etch process may selectively remove the dummy dielectric and may stop at the substrate 302, thereby forming the full trench in the gate structure. It is understood that other etching chemicals may be used for selectively removing the dummy dielectric and dummy poly gate.

A high k material layer or layers 303b may then be formed on the substrate 302. The high k layers may include an interfacial layer, a high-k dielectric layer, and/or a barrier layer. Additionally, a fill metal 308 is deposited to fill in the trench 305. In an embodiment, a layer of tantalum (Ta), tantalum nitride (TaN), titanium (Ti), titanium nitride (TiN), or combinations thereof, may be deposited to function as a wetting layer for a subsequent copper (Cu) fill. The Ta layer may be formed by PVD or other suitable process. A layer of metal 308 may be formed to fill in the trench 305. The metal layer 308 may be formed by forming a first metal layer by CVD and then forming a second metal layer by PVD. Alternatively, the fill metal 308 may optionally include tungsten (W), aluminum (Al), or other suitable metal material.

The method 100 continues with block 104 in which a chemical mechanical polishing (CMP) process is performed. In FIG. 3A, a CMP process, as shown by the downward arrows, is performed on the metal gate layer 308 to remove the excess metal (e.g., Cu outside of the trench 305) similar to the process described above. The CMP process may have a high selectivity to provide a substantially planar surface for the gate structure, including removing the PR 312 in the second region, as shown in FIG. 3B.

The method 100 continues with block 106 in which a wafer cleaning and rinsing process is performed on device 300, as shown by the downward arrows in FIG. 3B and similar to the process described above. In one embodiment, the wafer cleaning process includes brush cleaning the planarized or polished wafer to remove residue and contaminants introduced from the CMP process, for example using a cleaning unit of a CMP tool. The rinsing process may include rinsing and drying the cleaned wafer with isopropyl alcohol in one embodiment, using the cleaning unit of a CMP tool.

The method 100 continues with block 108 in which a wafer drying process is performed on rinsed device 300, as shown by the downward arrows in FIG. 3C and similar to the process described above. In one embodiment, the wafer drying process includes vacuum baking the rinsed device in an inert gas environment, for example using a drying unit of a CMP tool. In one embodiment, the vacuum baking process is performed at a temperature between about 25 degrees Celsius and about 400 degrees Celsius, at a pressure between about 0.1 torr and about 760 torr, in an inert gas environment of nitrogen, helium, argon, or mixtures thereof, and for less than five minutes. Advantageously, drying the rinsed device in an inert gas environment prevents corrosion of the exposed surface of metal layer 308, moisture adhesion onto the exposed surface of metal layer 308 from water in the atmosphere (i.e., promotes water desorption), and pitting on the exposed surface of metal layer 308, in particular advantageous when a queue time for further processing is increased.

The method 100 continues with block 110 in which the dried device 300 is transferred with in-situ inert gas for further processing, in one embodiment through a FOUP of a CMP tool. The inert gas may include nitrogen, helium, argon, or mixtures thereof. It is understood that the semiconductor device 300 may undergo further processing to form various features such as contacts/vias, interconnect metal layers, interlayer dielectric, passivation layers, etc.

It should be noted that the techniques and processes, such as lithography, etching, and high-k/metal gate formation, disclosed above with reference to FIGS. 3A-3C can also be implemented in the various embodiments disclosed above with reference to FIGS. 2A-2C and below with reference to FIGS. 4A-4C.

Referring now to FIGS. 4A-4C are cross-sectional views of an embodiment of a semiconductor device 400 at various stages of fabrication according to the method of FIG. 1. Similarly numbered features and processes shown in FIGS. 4A-4C may be formed substantially the same as that described above with respect to FIGS. 3A-3C, such as a substrate 402, a dielectric layer 404, a dummy gate structure 410, a dummy insulator layer 403a, a metal gate structure 408, a high-k insulator layer 403b, a photoresist layer 412, the wafer CMP process, the wafer cleaning and rinsing process, and the wafer drying process. The device 400 includes multiple metal gates 408 in a first region and multiple dummy gates 410 in a second region within the dielectric layer 404. As such, the first region is configured to be formed as a transistor device and the second region is formed to include an inductor or similar component.

In addition to the process discussed above with respect to FIGS. 3A-3C, the device 400 includes isolation structures 414, such as shallow trench isolation (STI) or LOCOS features formed in the substrate 402 for isolating active regions from other regions of the substrate 402. The active regions may be configured as an NMOS device (e.g., nFET) or as a PMOS device (e.g., pFET) including source/drain regions 416.

It is understood that the semiconductor device 400 may undergo further processing to form various features such as contacts/vias, interconnect metal layers, interlayer dielectric, passivation layers, inductors, capacitors, etc. It should be noted that the techniques and processes disclosed with reference to FIGS. 4A-4C can also be implemented in the embodiments of FIGS. 2A-2D and 3A-3C disclosed above.

Referring now to FIG. 5, a diagram of an embodiment of a metal CMP tool 500 is illustrated according to various aspects of the present disclosure. An embodiment of CMP tool 500 includes at least one front opening unified pod (FOUP) 502, a loading/unloading (L/UL) unit 504 operably coupled to the FOUP 502, a CMP unit 506 operably coupled to the L/UL unit 504, a wafer station 508 operably coupled to the CMP unit 506, a cleaning unit 510 operably coupled to the wafer station 508, and a drying unit 516 operably coupled to the cleaning unit 510. The FOUP 502, L/UL unit 504, CMP unit 506, wafer station 508, cleaning unit 510, and drying unit 516 are operably coupled to one another through various transporters, such as conveyors, robot arms, and the like. Robot arms may be configured to move translationally (e.g., linearly along a track), to turn over a wafer for providing processing access to both sides of a wafer, and/or to swing about a pivot point. Robot arms may include wafer engagement or handling tools, referred to as end effectors, which are mounted at the distal ends of the arms. These end effectors or other engagement tools may engage and support each wafer as it is transferred. In some instances, vacuum may be utilized to hold a wafer. The robot arms may handle one or more wafers simultaneously or individually as required.

In one embodiment, FOUP 502 is operably coupled to L/UL unit 504 and provides manual and/or automated access to CMP tool 500 for additional processing of an IC wafer. Wafers may be transferred into and out of CMP tool 500 through FOUP 502, and in some embodiments, a plurality of FOUPs 502 may be included in CMP tool 500. In FIG. 5, four FOUPs 502 are illustrated but more or less FOUPs may be included.

In one embodiment, L/UL unit 504 is operably coupled between FOUP 502 and CMP unit 506, and includes a robot arm 521 for transferring wafers between FOUP 502 and CMP unit 506. Robot arm 521 may be movable along a transverse axis in one embodiment to access a plurality of FOUPs 502. L/UL unit 504 is also coupled to an inert gas supply 518 in one embodiment to provide for an inert gas environment when transferring processed and dried wafers out of the CMP tool 500.

In one embodiment, CMP unit 506 is operably coupled between L/UL unit 504 and wafer station 508, and includes conveyor transporters 523 and a robot arm 529 for transferring wafers between the L/UL unit 504 and the CMP unit 506. The CMP process is performed on the metal layer 208, the barrier layer 206, and the dielectric layer 204, to remove excess metal (e.g., metal outside of the trenches 205), thereby exposing and making coplanar a top surface of each of the metal layer 208, the barrier layer 206, and the dielectric layer 204, as shown in FIG. 2B. CMP unit 506 includes typical instruments and apparatus to perform a CMP process as known in the art to planarize the metal conductor and the dielectric layer of a wafer. In one embodiment, CMP unit 506 further includes rotating holders 506a for mounting a wafer and lowering the wafer onto a pad or table head surface 506b, which is configured to rotate in the opposite direction as the wafer. A CMP slurry suspended in a mild etchant, such as potassium or ammonium hydroxide, may then be applied to the polishing pad through a slurry feed. Typical CMP slurries may be used for the CMP process, such as slurries including ferric nitrate, peroxide, potassium iodate, ammonia, silica, and/or alumina, but other slurry materials are applicable. The rotating wafer is pressed face-down against the rotating polishing pad and the slurry is pressed against the face of the wafer by the pad.

In one embodiment, a robot arm 525 is operably coupled between CMP unit 506 and wafer station 508, and is configured to swing about a pivot point for transferring wafers from CMP unit 506 to wafer station 508. Other configurations of robot arm 525 for transferring wafers between CMP unit 506 and wafer station 508 are within the scope of the present disclosure. Wafer station 508 is configured to cue a plurality of wafers processed by CMP unit 506 for a cleaning and rinsing process in cleaning unit 510. Wafer station 508 may store a plurality of wafers in vertical stacks and/or horizontal groups, and includes a robot arm 527 configured to access wafers and to turn over wafers as necessary.

In one embodiment, cleaning unit 510 is operably coupled between wafer station 508 and L/UL unit 504, and is configured to perform a cleaning and rinsing process on wafers processed by CMP unit 506. Cleaning unit 510 may include a brushing module 512 that removes residue introduced from the CMP process and a rinsing module 514 for rinsing the brushed wafer with an alcohol, such as isopropyl alcohol. In one embodiment, cleaning unit 510 may include horizontal and/or vertical cleaners, polyvinylalcohol (PVA) brush scrubbers, megasonic cleaners, and a chemical drip manifold or spray nozzles. In yet another embodiment, cleaning unit 510 is operable to perform a wafer cleaning process which includes buffing, brush cleaning, megasonic cleaning, and/or a spin-rinse cycle. Some or all of these processes may be included in the cleaning and rinsing process. Cleaning unit 510 may include soft pads, oxide slurries inlets, DI water inlets, or ammonium hydroxide inlets for buffing the wafers. Brush cleaning the planarized or polished wafer includes scrubbing the wafer with a cleaning solution to remove residue from the CMP process. Typical scrubbers may be used, including one or more rotating cylindrical brushes that contact and brush the slurry residue, particles, and other contaminants from a wafer surface. Double-sided scrubbers may simultaneously scrub the top and bottom surfaces of a wafer with two rotating cylindrical brushes. Each wafer may lie flat on a conveyor mechanism which moves the wafer into and between the brushes. When the wafer is being scrubbed, the conveyor mechanism, rollers, and brushes may support and hold the wafer horizontally. The wafer itself may be rotated while one or both surfaces are scrubbed by the brushes. One or more rollers may engage the edge of the semiconductor wafer to rotate the wafer. The cleaning solution may include typical cleaning chemistries, such as a surfactant, an acid, an alkaline, and DI water, but other cleaning chemistries are applicable. In one example, the cleaning solution may include hydrofluoric acid, citric acid, ammonium hydroxide, and/or deionized water to remove particles, metal, and oxide. A megasonic cleaning module may also be included for using sound waves and cleaning chemicals to clean the wafer. The rinsing process may include spinning and rinsing the wafer with a cleaning solution (SC1) and/or water, followed by application of isopropyl alcohol.

In one embodiment, drying unit 516 is operably coupled to the L/UL unit 504 for receiving the wafer from cleaning unit 510 and for drying the cleaned and rinsed wafer in a heated and inert gas environment, in which temperature, pressure, inert gas, processing time, and/or combinations thereof are controlled. Drying unit 516 may include a vacuum baking chamber or furnace with a heating source, such as heating coils, gases, and/or lamps, which may supply heat to dry one or more wafers at a time. For the case of multiple wafers, drying unit 516 may include support rails or tracks which extend vertically and/or horizontally within the chamber to support multiple wafers in spaced parallel relationship. Drying unit 516 may further include an inert gas supply 518 for supplying an inert gas such as nitrogen, helium, argon, or mixtures thereof to the baking chamber, and a vacuum pump 520 for controlling the pressure and environment within the baking chamber. In one example, drying unit 516 is configured to vacuum bake the rinsed wafer at a temperature between about 25 degrees Celsius and about 400 degrees Celsius, at a pressure between about 0.1 torr and about 760 torr, in an inert gas environment of nitrogen, helium, argon, or mixtures thereof, and for less than five minutes. Advantageously, drying the rinsed device in an inert gas environment prevents or hinders corrosion of the exposed surface of the metal layer, prevents or hinders moisture adhesion onto the exposed surface of the metal layer from water in the atmosphere (i.e., promotes water desorption), and prevents or hinders pitting on the exposed surface of the metal layer, in particular advantageous when a queue time for further processing is increased. Furthermore, drying unit 516 may be easily integrated into existing CMP tools, such as those available from Applied Materials, Inc. of Santa Clara, Calif., thereby providing a simple integrated platform with high performance and less wafer processing cue-time constraints.

In one embodiment, the vacuum baked wafer is transferred through L/UL unit 504 and FOUP 502 for further processing. As mentioned above, L/UL unit 504 and FOUP 502 may provide for and operate in an in-situ inert gas environment.

Although not shown, CMP tool 500 may be operably coupled to a computer including software for automated wafer transferring and handling, CMP processing, wafer cleaning and rinsing, and wafer drying to name some of the control functions for CMP tool 500. The computer system is suitable for implementing one or more embodiments of the present disclosure, and in various implementations may comprise a personal computing device such as a personal computer, laptop, cell phone, PDA, etc., or may comprise a network computing device such as a network server.

In accordance with various embodiments of the present disclosure, the computer system includes a bus or other communication mechanism for communicating information, which interconnects subsystems and components, such as processing component (e.g., processor, micro-controller, digital signal processor (DSP), etc.), system memory component (e.g., RAM), static storage component (e.g., ROM), disk drive component (e.g., magnetic or optical), network interface component (e.g., modem or Ethernet card), display component (e.g., CRT or LCD), input component (e.g., keyboard), and cursor control component (e.g., mouse or trackball). In one implementation, the disk drive component may comprise a database having one or more disk drive components.

In accordance with embodiments of the present disclosure, the computer system performs specific operations by the processor executing one or more sequences of one or more instructions contained in the system memory component. Such instructions may be read into the system memory component from another computer readable medium, such as a static storage component or a disk drive component. In other embodiments, hard-wired circuitry may be used in place of or in combination with software instructions to implement the present disclosure.

Logic may be encoded in a computer readable medium, which may refer to any medium that participates in providing instructions to the processor for execution. Such a medium may take many forms, including but not limited to, non-volatile media, volatile media, and transmission media. In various implementations, non-volatile media includes optical or magnetic disks, such as a disk drive component, volatile media includes dynamic memory, such as system memory component, and transmission media includes coaxial cables, copper wire, and fiber optics, including wires that comprise the bus. In one example, transmission media may take the form of acoustic or light waves, such as those generated during radio wave and infrared data communications.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice embodiments of the present disclosure may be performed by the computer system. In various other embodiments of the present disclosure, a plurality of computer systems coupled by a communication link (e.g., a network such as a LAN, WLAN, PTSN, and/or various other wired or wireless networks, including telecommunications, mobile, and cellular phone networks) may perform instruction sequences to practice the methods of the present disclosure in coordination with one another.

The computer system may transmit and receive messages, data, information and instructions, including one or more programs (i.e., application code) through the communication link and communication interface. Received program code may be executed by the processor as received and/or stored in the disk drive component or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The present invention achieves different advantages in various embodiments disclosed herein. It is understood that different embodiments disclosed herein offer several different advantages, and that no particular advantage is necessarily required for all embodiments. For example, the present disclosed method and CMP tool provides an advantageous wafer drying process after CMP to substantially minimize, hinder, prevent, or remove time dependent dielectric breakdown, metal corrosion, metal oxidation, and/or metal pitting.

The present disclosure provides for many different embodiments. One of the broader forms of the present disclosure involves a method of fabricating a semiconductor device. The method includes providing an integrated circuit (IC) wafer including a metal conductor in a trench of a dielectric layer over a substrate, and performing a chemical mechanical polishing (CMP) process to planarize the metal conductor and the dielectric layer. The method further includes cleaning the planarized metal conductor and dielectric layer to remove residue from the CMP process, rinsing the cleaned metal conductor and dielectric layer with an alcohol, and drying the rinsed metal conductor and dielectric layer in an inert gas environment.

Another of the broader forms of the present disclosure involves a semiconductor device. The semiconductor device includes a substrate, a dielectric layer over the substrate, and a metal conductor in a trench of the dielectric layer. The metal conductor and the dielectric layer have a coplanar top surface, which is brush-cleaned, then rinsed with an alcohol, and then vacuum baked in an inert gas environment.

Another of the broader forms of the present disclosure involves a metal CMP tool. The metal CMP tool includes a first front opening unified pod (FOUP) configured to receive an integrated circuit (IC) wafer including a metal conductor in a trench of a dielectric layer over a substrate. The CMP tool further includes a CMP unit operably coupled to the first FOUP, the CMP unit configured to perform a CMP process to planarize the metal conductor and the dielectric layer. A cleaning unit is operably coupled to the CMP unit, the cleaning unit configured to clean the planarized metal conductor and dielectric layer to remove residue from the CMP process, and further configured to rinse the cleaned metal conductor and dielectric layer with an alcohol. A drying unit is operably coupled to the cleaning unit, the drying unit configured to vacuum bake the rinsed metal conductor and dielectric layer in an inert gas environment. A second FOUP is operably coupled to the drying unit, the second FOUP configured to transfer the vacuum baked wafer in an inert gas environment.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A chemical mechanical polishing (CMP) tool, comprising:
    a first front opening unified pod (FOUP) configured to receive an integrated circuit (IC) wafer including a metal conductor in a trench of a dielectric layer over a substrate;
    a CMP unit operably coupled to the first FOUP, the CMP unit configured to perform a CMP process to planarize the metal conductor and the dielectric layer;
    a cleaning unit operably coupled to the CMP unit, the cleaning unit configured to clean the planarized metal conductor and dielectric layer to remove residue from the CMP process, and further configured to rinse the cleaned metal conductor and dielectric layer with an alcohol;
    a drying unit operably coupled to the cleaning unit, the drying unit configured to vacuum bake the rinsed metal conductor and dielectric layer in an inert gas environment; and
    a second FOUP operably coupled to the drying unit, the second FOUP configured to transfer the dried wafer in an inert gas environment for further processing.

2. The CMP tool of claim 1, wherein the CMP unit includes a scrubber to apply a slurry to the wafer.

3. The CMP tool of claim 1, wherein the cleaning unit includes a brush, a slurry supply, an isopropyl alcohol supply, a deionized water supply, or spray nozzles.

4. The CMP tool of claim 1, wherein the drying unit includes a vacuum pump and an inert gas supply.

5. The CMP tool of claim 1, wherein the drying unit is configured to vacuum bake at a temperature between about 25 degrees Celsius and about 400 degrees Celsius, at a pressure between about 0.1 torr and about 760 torr, in an inert gas environment of nitrogen, helium, argon, or mixtures thereof, and for a time less than five minutes.

6. The CMP tool of claim 1, further comprising a wafer transport mechanism configured to transport the IC wafer between the units.

7. A chemical mechanical polishing (CMP) tool, comprising:
    a front opening unified pod (FOUP) configured to receive an integrated circuit (IC) wafer;
    a loading/unloading unit (L/UL) unit operably coupled to the FOUP;
    a CMP unit operably coupled to the L/UL unit, the CMP unit configured to perform a CMP process on the wafer;
    a wafer station operably coupled to the CMP unit, the wafer station configured to cue a plurality of wafers processed by the CMP unit;
    a cleaning unit operably coupled to the wafer station, the cleaning unit configured to perform a cleaning and rinsing process on wafers processed by the CMP unit; and
    a drying unit operably coupled to the cleaning unit, the drying unit configured to vacuum bake the wafer in an inert gas environment.

8. The CMP tool of claim 7, wherein the L/UL unit is operably coupled between the FOUP and CMP unit, and comprises a robot arm for transferring wafers between the FOUP and CMP unit.

9. The CMP tool of claim 7, wherein the L/UL unit is coupled to an inert gas supply.

10. The CMP tool of claim 7, wherein the CMP unit is operably coupled between the L/UL unit and the wafer station, and includes conveyor transporters and a robot arm for transferring wafers.

11. The CMP tool of claim 10, wherein the robot arm is configured to swing about a pivot point for transferring wafers from the CMP unit to the wafer station.

12. The CMP tool of claim 7, wherein the CMP unit comprises rotating holders for mounting and lowering a wafer.

13. The CMP tool of claim 7, wherein the cleaning unit comprises a brushing module that removes residue introduced from the CMP process and a rinsing module for rinsing a brushed wafer with an alcohol.

14. The CMP tool of claim 13, wherein the drying unit comprises an inert gas supply.

15. The CMP tool of claim 7, wherein the drying unit is operably coupled to the L/UL unit for receiving the wafer from the cleaning unit and drying a cleaned and rinsed wafer in a heated and inert gas environment.

16. A chemical mechanical polishing (CMP) tool, comprising:
- a CMP unit for planarizing a wafer;
- a cleaning unit operably coupled to the CMP unit, the cleaning unit configured to perform a cleaning process and an alcohol rinse process on the planarized wafer;
- a drying unit operably coupled to the cleaning unit, the drying unit configured to vacuum bake the cleaned and rinsed wafer in an inert gas environment; and
- a first transfer unit operably coupled to the drying unit for providing an inert gas environment after drying.

17. The tool of claim 16, further comprising:
- a second transfer unit, separate from the first transfer unit, for providing the wafer to the CMP unit.

18. The tool of claim 17, wherein,
wherein the first and second transfer units include first and second front opening unified pods (FOUPs), respectively.

19. The tool of claim 16, wherein the wafer includes a top surface having copper, aluminum, tungsten, or alloys thereof, and wherein the alcohol is isopropyl alcohol.

20. The tool of claim 16, wherein the drying unit is configured for a vacuum baking performed at a temperature between about 25 degrees Celsius and about 400 degrees Celsius.

* * * * *